(12) United States Patent
Matsumoto

(10) Patent No.: US 11,948,730 B2
(45) Date of Patent: Apr. 2, 2024

(54) INSULATOR-COATED MAGNETIC ALLOY POWDER PARTICLE, POWDER MAGNETIC CORE, AND COIL PART

(71) Applicant: SEIKO EPSON CORPORATION, Tokyo (JP)

(72) Inventor: Yasutaka Matsumoto, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 155 days.

(21) Appl. No.: 17/082,372

(22) Filed: Oct. 28, 2020

(65) Prior Publication Data

US 2021/0129218 A1    May 6, 2021

(30) Foreign Application Priority Data

Oct. 30, 2019    (JP) .................................. 2019-197241

(51) Int. Cl.
| | |
|---|---|
| B22F 1/02 | (2006.01) |
| B22F 1/102 | (2022.01) |
| B22F 1/16 | (2022.01) |
| H01F 1/24 | (2006.01) |
| H01F 3/08 | (2006.01) |
| H01F 27/255 | (2006.01) |
| H01F 41/02 | (2006.01) |

(52) U.S. Cl.
CPC ................ H01F 3/08 (2013.01); B22F 1/102 (2022.01); B22F 1/16 (2022.01); H01F 1/24 (2013.01); B22F 2301/15 (2013.01); B22F 2301/35 (2013.01); H01F 27/255 (2013.01); H01F 41/0246 (2013.01)

(58) Field of Classification Search
CPC ....................................................... B22F 1/16
See application file for complete search history.

(56) References Cited

U.S. PATENT DOCUMENTS

| | | | |
|---|---|---|---|
| 6,387,532 B1 | 5/2002 | Atarashi et al. | |
| 2008/0029300 A1* | 2/2008 | Harada | H01F 1/24 |
| | | | 427/127 |
| 2012/0012777 A1 | 1/2012 | Sugiyama et al. | |
| 2012/0274437 A1 | 11/2012 | Matsuura et al. | |
| 2012/0274438 A1 | 11/2012 | Hachiya et al. | |
| 2014/0049348 A1 | 2/2014 | Matsuura et al. | |
| 2014/0132383 A1 | 5/2014 | Matsuura et al. | |

(Continued)

FOREIGN PATENT DOCUMENTS

| | | |
|---|---|---|
| CN | 103846427 A | 6/2014 |
| CN | 110211760 A | 9/2019 |

(Continued)

OTHER PUBLICATIONS

Office Action for JP2019197241, dated Apr. 25, 2023, 5 pages of Office Action.

*Primary Examiner* — Xiaowei Su
(74) *Attorney, Agent, or Firm* — CHIP LAW GROUP

(57) ABSTRACT

An insulator-coated magnetic alloy powder particle includes a magnetic alloy powder particle and an insulator that coats a surface of the magnetic alloy powder particle and that has a plurality of protrusions at a surface thereof, wherein the insulator includes a first insulator in a particulate form enclosed in the protrusion, and a second insulator in a film form that coats at least a part of a surface of the first insulator.

10 Claims, 4 Drawing Sheets

(56) References Cited

U.S. PATENT DOCUMENTS

| | | | |
|---|---|---|---|
| 2014/0138570 | A1 | 5/2014 | Otsuka et al. |
| 2014/0139311 | A1 | 5/2014 | Matsuura et al. |
| 2016/0163448 | A1 | 6/2016 | Matsuura et al. |
| 2019/0267170 | A1 | 8/2019 | Nakamura |

FOREIGN PATENT DOCUMENTS

| | | |
|---|---|---|
| JP | H11131102 A | 5/1999 |
| JP | 2009010180 A | 1/2009 |
| JP | 2009099732 A | 5/2009 |
| JP | 2011146604 A | 7/2011 |
| JP | 2012238828 A | 12/2012 |

\* cited by examiner

INSULATOR-COATED MAGNETIC ALLOY POWDER PARTICLE, POWDER MAGNETIC CORE, AND COIL PART

The present application is based on, and claims priority from JP Application Serial Number 2019-197241, filed on Oct. 30, 2019, the disclosure of which is hereby incorporated by reference herein in its entirety.

BACKGROUND

1. Technical Field

The present disclosure relates to an insulator-coated magnetic alloy powder particle, a powder magnetic core, and a coil part.

2. Related Art

Heretofore, there have been known magnetic alloy powder particles used for a magnetic core of an inductor or the like. The surfaces of such particles are subjected to an insulation treatment for suppressing an eddy current flowing between the particles. For example, JP-A-2012-238828 (Patent Document 1) discloses a magnetic material obtained by coating the surfaces of particles of a soft magnetic alloy with an oxide coating film of the soft magnetic alloy.

However, in the magnetic material described in Patent Document 1, the effect of a displacement current becomes large when it is used at high frequency, and therefore, it is necessary to increase the value of capacitive reactance for suppressing the displacement current. Capacitive reactance $Xc$ is represented by a following formula (1), and capacitance $C$ in the following formula (1) is represented by a following formula (2).

$$Xc = 1/2\pi fC \tag{1}$$

$$C = Sk/d \tag{2}$$

From the above formulae (1) and (2), in order to increase the capacitive reactance $Xc$, the capacitance $C$ is decreased. In order to decrease the capacitance $C$, an area $S$ or a permittivity $k$ is decreased or a film thickness $d$ of an insulation treatment film is increased.

In order to improve the performance of an inductor using a magnetic material for a magnetic core, there is a method in which the magnetic permeability is increased by decreasing the film thickness $d$ of an insulation treatment coating film. However, when the film thickness $d$ is decreased, from the above formulae (1) and (2), the capacitive reactance $Xc$ is decreased, and the eddy current loss between particles is increased when an electric current is allowed to flow through the inductor. When the eddy current loss is increased, the performance as the inductor is decreased. Further, when the film thickness $d$ is increased, the capacitive reactance $Xc$ is increased, whereas the magnetic permeability is decreased, and the performance as the inductor also tends to be decreased. That is, the magnetic permeability and the eddy current loss between particles are in a relationship that they tend to conflict with each other.

Further, in a method in which not the film thickness $d$, but the permittivity $k$ is decreased, even if a material has a small permittivity $k$, the permittivity is 2 or so, and therefore, in order to further decrease the permittivity $k$, a configuration in which a hollow wall is provided in the insulation treatment film is considered. However, if the insulation treatment film with a hollow wall is formed in a state where a metal of the magnetic material is exposed, when a high voltage is applied, an electric charge is induced at a surface of the insulation treatment film, and electrical discharge occurs at a surface of an insulator, resulting in electrical breakdown.

SUMMARY

In view of this, an object of the present disclosure is to provide an insulator-coated magnetic alloy powder particle capable of reducing the eddy current loss between the particles in a high-frequency region without decreasing the magnetic permeability and the DC dielectric strength.

An insulator-coated magnetic alloy powder particle includes a magnetic alloy powder particle, and an insulator that coats a surface of the magnetic alloy powder particle and that has a plurality of protrusions at a surface thereof, wherein the insulator includes a first insulator in a particulate form enclosed in the protrusion, and a second insulator in a film form that coats at least a part of a surface of the first insulator.

In the insulator-coated magnetic alloy powder particle, the second insulator may have a film thickness of 2 nm or more and 20 nm or less.

In the insulator-coated magnetic alloy powder particle, the second insulator may have a volume resistivity of $1 \times 10^{14}$ $\Omega \cdot$cm or more and $1 \times 10^{17}$ $\Omega \cdot$cm or less.

In the insulator-coated magnetic alloy powder particle, the first insulator may have an average particle diameter of 4 nm or more and 40 nm or less.

In the insulator-coated magnetic alloy powder particle, the first insulator may have a relative permittivity of 2 or more and 4 or less.

In the insulator-coated magnetic alloy powder particle, one particle of the first insulator may be present per 43 nm$^2$ to 10000 nm$^2$ surface area of the magnetic alloy powder particle.

A powder magnetic core is formed by compacting the insulator-coated magnetic alloy powder particles.

A coil part includes the powder magnetic core.

A powder magnetic core is formed by compacting magnetic alloy powder particles and an insulator that coats surfaces of the magnetic alloy powder particles, wherein the insulator includes a first insulator in a particulate form, and a second insulator in a film form that coats at least a part of a surface of the first insulator, and a void surrounded by the first insulator or the second insulator is included.

A coil part includes the powder magnetic core.

DESCRIPTION OF EXEMPLARY EMBODIMENTS

1. First Embodiment

Figure 1:
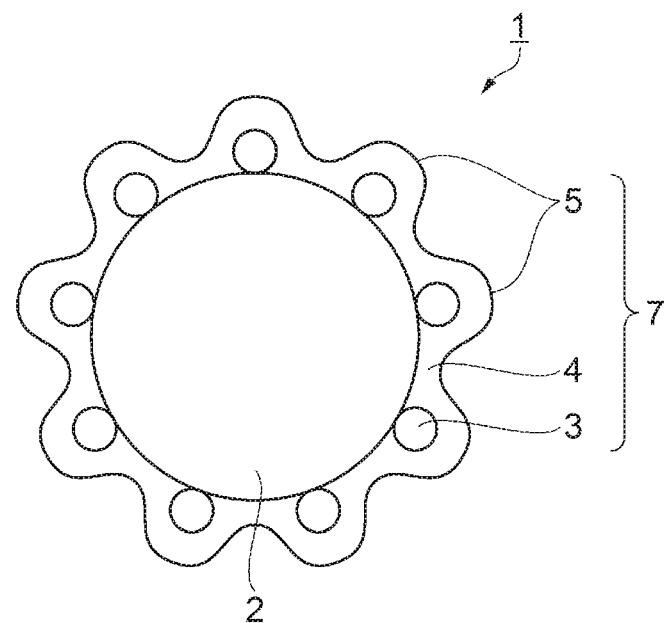
FIG. 1 is a schematic cross-sectional view showing one particle of an insulator-coated magnetic alloy powder particle according to a first embodiment.

A configuration of an insulator-coated magnetic alloy powder particle according to a first embodiment will be described. FIG. 1 is a schematic cross-sectional view showing one particle of the insulator-coated magnetic alloy powder particle.

1.1. Insulator-Coated Magnetic Alloy Powder Particle

As shown in FIG. 1, an insulator-coated magnetic alloy powder particle 1 of this embodiment includes a magnetic alloy powder particle 2 and an insulator 7. The insulator 7 coats a surface of the magnetic alloy powder particle 2 and has a plurality of protrusions 5 at a surface thereof. Note that in the following description, the insulator-coated magnetic alloy powder particle 1 is sometimes simply referred to as "insulator-coated particle 1".

1.2. Magnetic Alloy Powder Particle

The magnetic alloy powder particle 2 is a particle containing a soft magnetic material. Examples of the soft magnetic material contained in the magnetic alloy powder particle 2 include pure iron, various types of Fe-based alloys such as an Fe—Si-based alloy such as silicon steel, an Fe—Ni-based alloy such as permalloy, an Fe—Co-based alloy such as permendur, an Fe—Si—Al-based alloy such as Sendust, an Fe—Cr—Si-based alloy, and an Fe—Cr—Al-based alloy, various types of Ni-based alloys, and various types of Co-based alloys. Among these, various types of Fe-based alloys are preferably used from the viewpoint of magnetic characteristics such as magnetic permeability and magnetic flux density, and productivity such as cost.

The crystalline property of the soft magnetic material is not particularly limited, and the soft magnetic material may be any of a crystalline material, a non-crystalline (amorphous) material, and a microcrystalline (nanocrystalline) material. Among these crystalline properties, the soft magnetic material preferably contains an amorphous material or a microcrystalline material, and more preferably contains an amorphous material. According to this, the coercive force of the soft magnetic material becomes small, and the hysteresis loss is reduced, so that the magnetic permeability and magnetic flux density are improved, and also the iron loss is reduced when the material is compacted.

Examples of the soft magnetic material capable of forming an amorphous material or a microcrystalline material include Fe-based alloys such as Fe—Si—B-based, Fe—Si—B—C-based, Fe—Si—B—Cr—C-based, Fe—Si—Cr-based, Fe—B-based, Fe—P—C-based, Fe—Co—Si—B-based, Fe—Si—B—Nb-based, and Fe—Zr—B-based alloys, Ni-based alloys such as Ni—Si—B-based and Ni—P—B-based alloys, and Co-based alloys such as Co—Si—B-based alloys. For the magnetic alloy powder particle 2, a plurality of types of soft magnetic materials having different crystalline properties may be used.

The soft magnetic material is contained in an amount of preferably 50 mass % or more, more preferably 80 mass % or more, further more preferably 90 mass % or more with respect to the total mass of the magnetic alloy powder particle 2. According to this, the soft magnetic property of the magnetic alloy powder particle 2 is improved.

The magnetic alloy powder particle 2 may contain an impurity or an additive other than the soft magnetic material. Examples of the additive include various types of metal materials, various types of non-metal materials, and various types of metal oxide materials.

The average particle diameter of the magnetic alloy powder particle 2 is not particularly limited, but is, for example, 0.25 μm or more and 250.00 μm or less. The average particle diameter as used herein refers to a volume-based particle size distribution (50%). The average particle diameter is measured by a dynamic light scattering method or a laser diffraction method described in JIS Z 8825. Specifically, for example, a particle size distribution meter using a dynamic light scattering method as a measurement principle can be adopted.

A method for producing the magnetic alloy powder particles 2 is not particularly limited, but examples thereof include various types of atomization methods such as a water atomization method, a gas atomization method, and a spinning water atomization method, a reducing method, a carbonyl method, and a pulverization method. Among these, an atomization method is preferably adopted from the viewpoint that small particles are efficiently produced while suppressing a variation in particle diameter.

1.3. Insulator

The insulator 7 includes a first insulator 3 in a particulate form and a second insulator 4 in a film form. The first insulator 3 is enclosed in each of the plurality of protrusions 5. The second insulator 4 coats at least a part of a surface of the first insulator 3 and a part of a surface of the magnetic alloy powder particle 2. Specifically, the second insulator 4 coats the surface of each of the first insulator 3 and the magnetic alloy powder particle 2 other than regions where the first insulator 3 and the magnetic alloy powder particle 2 are in contact with each other of the surfaces thereof.

1.3.1. First Insulator

A plurality of first insulators 3 are in contact with the surface of the magnetic alloy powder particle 2. The first insulator 3 is in a particulate form and is smaller than the magnetic alloy powder particle 2. It is preferred that one particle of the first insulator 3 is present per 43 $nm^2$ to 10000 $nm^2$ surface area of the magnetic alloy powder particle 2, and it is more preferred that one particle of the first insulator 3 is present per 97 $nm^2$ to 625 $nm^2$ surface area.

The average particle diameter of the first insulator 3 is 4 nm or more and 40 nm or less, more preferably 6 nm or more and 10 nm or less. According to this, in the insulator 7, the protrusions 5 are easily formed, and also when the insulator-coated particles 1 are compacted, the below-mentioned void is easily generated by the protrusions 5. The average particle diameter of the first insulator 3 can be measured in the same manner as in the case of the magnetic alloy powder particle 2. Note that the shape of the protrusion 5 can be changed according to the average particle diameter of the first insulator 3 or the like.

The relative permittivity of the first insulator 3 is 2 or more and 4 or less. The relative permittivity of the first insulator 3 can be obtained by analyzing components and performing calculation based on the components.

The volume resistivity of the first insulator 3 is preferably $1 \times 10^{14}$ Ω·cm or more and $1 \times 10^{12}$ Ω·cm or less. According to this, the DC dielectric strength and magnetic permeability in the insulator-coated particle 1 can be improved. For the volume resistivity of the first insulator 3, a known numerical value or a known measurement method can be adopted.

Examples of a forming material of the first insulator 3 include aluminum oxide, aluminum fluoride, silicon oxide such as crystalline silica and amorphous silica, a fluorine-based resin such as polytetrafluoroethylene, a silicone resin, paraffin, and an elastomer such as urethan rubber. For the first insulator 3, among these forming materials, one type is used alone or a plurality of types are used.

1.3.2. Second Insulator

The second insulator 4 is in a film form and coats the magnetic alloy powder particle 2 and the first insulator 3. That is, the insulator 7 including the first insulator 3 and the second insulator 4 coats the surface of the magnetic alloy powder particle 2 so that the magnetic alloy powder particle 2 is not exposed at the surface of the insulator-coated particle 1. Therefore, a part of the first insulator 3 may be exposed at the surface of the insulator-coated particle 1 without being coated with the second insulator 4.

The second insulator 4 protrudes in a convex shape in a region that coats the first insulator 3, thereby forming the protrusion 5 of the insulator 7. That is, the protrusion 5 is present at a position corresponding to the first insulator 3. Therefore, the number of protrusions 5 in one particle of the insulator-coated particle 1 corresponds to the number of first insulators 3 present at the surface of one particle of the magnetic alloy powder particle 2.

The film thickness of the second insulator 4 is 2 nm or more and 20 nm or less, more preferably 3 nm or more and 5 nm or less. According to this, in the insulator 7, the protrusions 5 are easily formed, and also when the insulator-coated particles 1 are compacted, the below-mentioned void is easily generated by the protrusions 5. The shape of the protrusion 5 can also be changed according to the film thickness of the second insulator 4 as well as the average particle diameter of the first insulator 3. The film thickness of the second insulator 4 can be found from the average of the film thickness measured at 5 or more sites by observing the cross section of the insulator-coated particle 1 using a transmission electron microscope or the like.

The volume resistivity of the second insulator 4 is $1 \times 10^{14}$ $\Omega \cdot cm$ or more and $1 \times 10^{17}$ $\Omega \cdot cm$ or less. According to this, the DC dielectric strength and magnetic permeability in the insulator-coated particle 1 can be improved. For the volume resistivity of the second insulator 4, a known numerical value or a known measurement method can be adopted in the same manner as the first insulator 3.

Examples of a forming material of the second insulator 4 include aluminum oxide, silicon oxide such as crystalline silica and amorphous silica, a fluorine-based resin such as polytetrafluoroethylene, fluorocarbon, and a silicone-based resin such as a polysilazane compound and a silicone compound. The forming material of the first insulator 3 and the forming material of the second insulator 4 may be the same forming material, or different forming materials may be used in combination.

1.4. Powder Magnetic Core

The insulator-coated particle 1 is preferably used for a powder magnetic core included in a coil part such as an inductor or a toroidal coil. Further, the insulator-coated particle 1 is also used for a magnetic element other than the coil part such as an antenna or an electromagnetic wave absorber. Therefore, the powder magnetic core is molded into a desired shape in accordance with the intended use thereof.

A powder magnetic core 100 according to this embodiment is produced by mixing the insulator-coated particles 1 and a binder or the like, thereby preparing a mixture, and compression molding the mixture while heating. That is, the powder magnetic core 100 is formed by compacting the insulator-coated particles 1.

Figure 2:
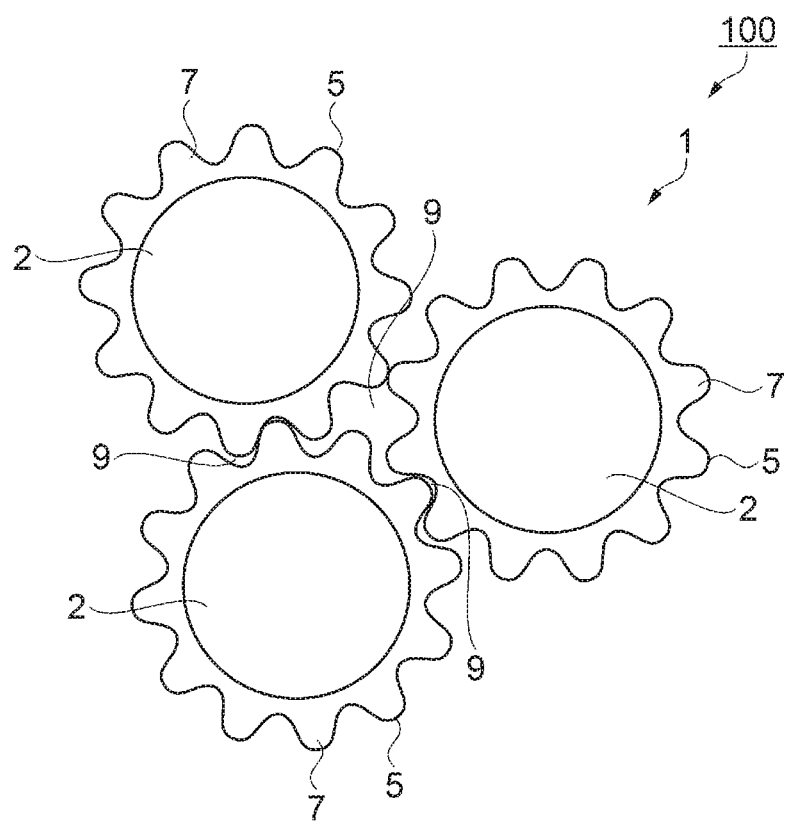
FIG. 2 is a schematic view showing a structure of a powder magnetic core.

Hereinafter, a state of the insulator-coated particles 1 inside the powder magnetic core 100 will be described. FIG. 2 is a schematic view showing a structure of the powder magnetic core. FIG. 2 is a view schematically illustrating a state of three insulator-coated particles 1 in the powder magnetic core 100. Further, in FIG. 2, illustration of the first insulator 3 included in the insulator-coated particle 1 and the binder is omitted.

As shown in FIG. 2, the powder magnetic core 100 is formed by compacting the insulator-coated particles 1 each including the magnetic alloy powder particle 2 and the insulator 7 that coats the surface of the magnetic alloy powder particle 2. The insulator 7 includes the first insulator 3 in a particulate form and the second insulator 4 in a film form, (not illustrated). The second insulator 4 coats at least a part of the first insulator 3.

Here, it is preferred that the entire surface of the magnetic alloy powder particle 2 is coated with the insulator 7, but a region that is not coated with the insulator 7 may be partially present. Even if an uncoated region is partially present, a chance of matching the regions when the magnetic alloy powder particles 2 are compacted is reduced, and therefore, a desired effect such as suppression of creeping discharge is obtained. The phrase "the entire surface of the magnetic alloy powder particle 2 is coated" refers that the cross section of the insulator-coated particle 1 is observed at 5 or more sites using a transmission electron microscope or the like, and a defect such as peeling is not detected between the second insulator 4 and the magnetic alloy powder particle 2 in the observed field of view.

In the powder magnetic core 100, a plurality of insulator-coated particles 1 are gathered and aggregated by compression molding as compaction. At that time, the plurality of protrusions 5 included in the respective insulator-coated particles 1 interfere with each other so that a void 9 is generated between the insulator-coated particles 1. That is, the powder magnetic core 100 includes the void 9 surrounded by the second insulator 4. As described above, when the first insulator 3 is exposed at the surface of the insulator-coated particle 1, the void 9 surrounded by the first insulator 3 may be included. The permittivity of air is about 1.00, and therefore, in the powder magnetic core 100, the total permittivity is decreased by the void 9.

In the past, as a method for reducing the permittivity utilizing air, a method in which magnetic bodies are coated with an insulating porous film, and air in pores, that is, a hollow wall is utilized, or a method in which insulator particles are adhered to magnetic bodies and air between the magnetic bodies is utilized were studied.

According to the method using a porous film, when magnetic bodies are compacted, the contact between the magnetic bodies is suppressed by the porous film. However, at a bottom portion of the pore of the porous film, a surface of the magnetic body is exposed, and therefore, when a high voltage was applied, electrical discharge sometimes occurred in a region where the pores of adjacent magnetic bodies face each other. Further, in the magnetic body to which the insulator particles are adhered, a region where the surface of the magnetic body is exposed is present in a place where the insulator particle is not adhered. Therefore, when the magnetic bodies were gathered by compaction, electrical discharge sometimes occurred in the same manner as described above in a region where the surfaces of the magnetic bodies are near to each other. In this manner, it was difficult to improve the dielectric strength by utilizing air in the past.

On the other hand, in the powder magnetic core 100 of the insulator-coated particles 1, not only the surface of the magnetic alloy powder particle 2 is coated with the insulator 7, but also the void 9 is formed by interference of the protrusions 5. Therefore, in the powder magnetic core 100, the dielectric strength is improved while decreasing the permittivity between the magnetic alloy powder particles 2.

When the insulator-coated particles 1 are compacted, stress acts on the insulator-coated particles 1. In particular, bending stress or the like is applied to the protrusions 5 at the surface of the insulator-coated particle 1. Therefore, when the above-mentioned forming material is used for the second insulator 4, it is preferred to perform compaction at a pressing pressure equal to or lower than the bending strength of each of the forming materials. According to this, the formation of the void 9 can be facilitated while suppressing the occurrence of breakage of the protrusion 5.

The forming materials of the second insulator 4 and the numerical value of the bending strength thereof are shown below as examples. The numerical value in parentheses of each forming material is the bending strength: aluminum oxide (about 350 MPa), quartz (about 150 MPa), amorphous silica (about 150 MPa), polytetrafluoroethylene (about 600 MPa).

1.5. Method for Producing Insulator-Coated Magnetic Alloy Powder Particles

Figure 3:
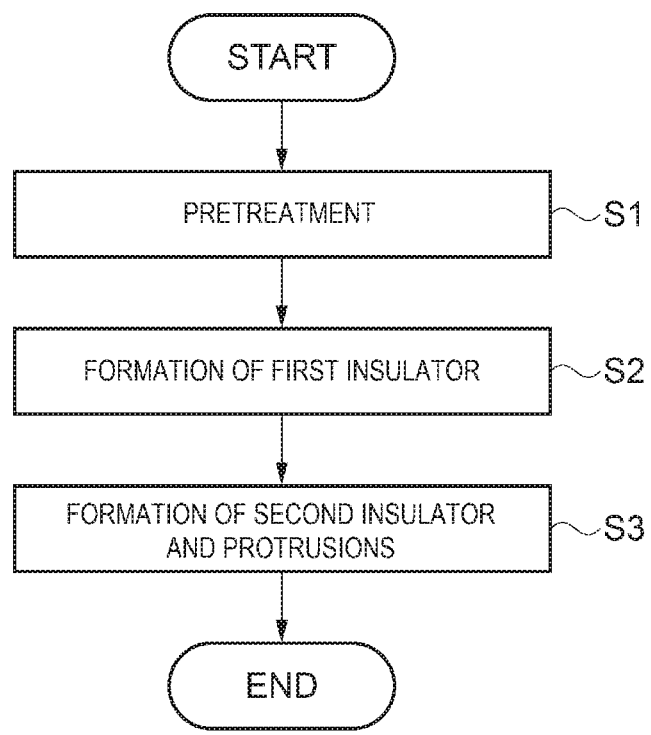
FIG. 3 is a process flow diagram showing a method for producing the insulator-coated magnetic alloy powder particles.
Figure 4:
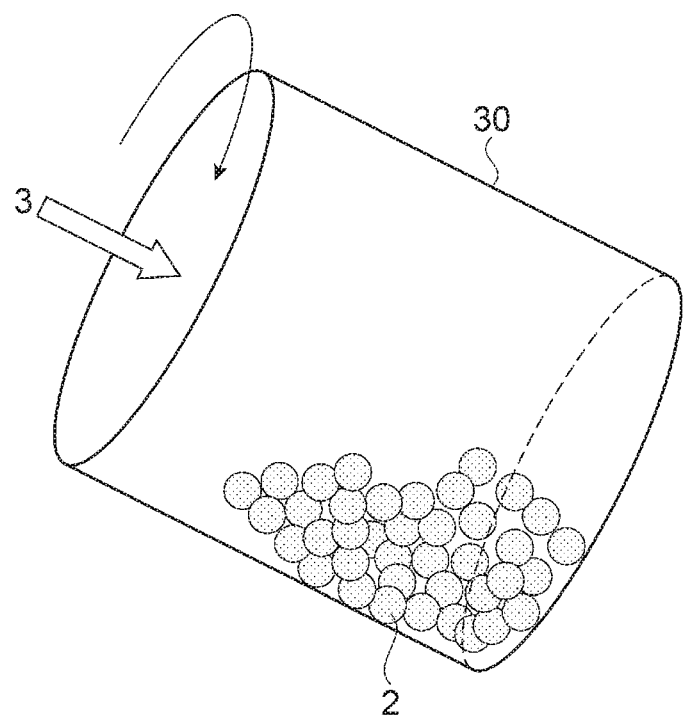
FIG. 4 is a schematic view showing one example of the method for producing the insulator-coated magnetic alloy powder particles.

A method for producing the insulator-coated particles 1 will be described. FIG. 3 is a process flow diagram showing the method for producing the insulator-coated magnetic alloy powder particles. FIG. 4 is a schematic view showing one example of the method for producing the insulator-coated magnetic alloy powder particles.

As shown in FIG. 3, the method for producing the insulator-coated particles 1 of this embodiment includes Step S1 to Step S3. The process flow shown in FIG. 3 is an example and is not limited thereto.

In Step S1, a pretreatment is performed for the magnetic alloy powder particles 2. Specifically, at the surfaces of the magnetic alloy powder particles 2, an adhered substance such as an organic substance is removed, and also the wettability of the surfaces is improved. Examples of the pretreatment include an ozone treatment and a plasma treatment. Specifically, in the ozone treatment, the magnetic alloy powder particles 2 are exposed to an atmosphere with an ozone concentration of 5000 ppm for 10 minutes or more.

In the plasma treatment, a gas such as He (helium), Ar (argon), $N_2$ (nitrogen), $H_2O$ (water), $O_2$ (oxygen), or Ne (neon) is used in atmospheric pressure plasma or vacuum plasma. At that time, it is preferred not to use a gas that remains at the surfaces of the magnetic alloy powder particles 2 or etches the surfaces such as $F_2$ (fluorine) or $Cl_2$ (chlorine).

As an index of the wettability of the surface of the magnetic alloy powder particle 2, a contact angle of water is used. The contact angle of water after the pretreatment in Step S1 at the surface of the magnetic alloy powder particle 2 is set to 15° or less. According to this, the adhesion of the first insulator 3 and the second insulator 4 to the magnetic alloy powder particle 2 is improved. Then, the process proceeds to Step S2.

In Step S2, the first insulator 3 in a particulate form is formed at the surfaces of the magnetic alloy powder particles 2. Specifically, for example, as shown in FIG. 4, the magnetic alloy powder particles 2 are placed in a cylindrical vessel 30, and particles of the forming material of the first insulator 3 are fed thereto while rotating the tilted cylindrical vessel 30. By this operation, the first insulator 3 is adhered to the surfaces of the magnetic alloy powder particles 2 by an electrostatic interaction or the like.

The average particle diameter of the forming material of the first insulator 3 to be fed to the cylindrical vessel 30 is set to the average particle diameter of the first insulator 3 described above. The number of first insulators 3 to be adhered to the surface of the magnetic alloy powder particle 2 is set within the numerical value range with respect to the surface area of the magnetic alloy powder particle 2 described above. Then, the process proceeds to Step S3.

In Step S3, the second insulator 4 and the protrusion 5 are formed for the magnetic alloy powder particles 2 with the first insulator 3 adhered thereto. Examples of a method for forming the second insulator 4 and the protrusion 5 include an ALD (Atomic Layer Deposition) method, a sol-gel method, a dipping method, a thermal oxidation method, a CVD (Chemical Vapor Deposition) method, and a direct coating method.

When adopting an ALD method, for example, in order to form silicon oxide as the second insulator 4, a silicon-containing compound such as tridimethylaminosilane is used. As the silicon-containing compound, a compound containing an alkyl group or an amino group having an alkyl group that easily reacts with a hydroxy group by heat is used. First, the silicon-containing compound is reacted with the magnetic alloy powder particles 2 with the first insulator 3 adhered thereto by heat. Subsequently, the surface is oxidized with ozone, water, or oxygen plasma. Then, the procedure is repeated from the reaction of the silicon-containing compound again until the above-mentioned film thickness of the second insulator 4 is obtained.

When adopting a sol-gel method, for example, in order to form silicon oxide as the second insulator 4, a silicon compound having 2 to 4 alkoxy groups per molecule such as tetraethyl orthosilicate is used.

First, a mixed liquid in which the silicon compound, water for a reaction, and ammonia serving as a catalyst are added to ethanol is prepared. Subsequently, to the mixed liquid, the magnetic alloy powder particles 2 with the first insulator 3 adhered thereto are added, and the second insulator 4 is formed by hydrolysis and polycondensation reaction of the alkoxy groups in the silicon compound, thereby coating the magnetic alloy powder particles 2 and the first insulators 3. At that time, the protrusions 5 are also formed.

When adopting a plasma CVD method among the CVD methods, for example, in order to form silicon oxide as the second insulator 4, a silicon compound in which hydrogen, an alkyl group, or an alkoxy group is added to a silicon atom is used. For the magnetic alloy powder particles 2 with the first insulator 3 adhered thereto, the second insulator 4 and the protrusion 5 are formed by introducing the silicon compound into a device and oxidizing the silicon compound in oxygen plasma. Alternatively, for the magnetic alloy powder particles 2 with the first insulator 3 adhered thereto, the second insulator 4 and the protrusion 5 may be formed by introducing an organosilane into a device and causing a polymerization reaction in argon plasma.

Further, for example, in order to form fluorocarbon as the second insulator 4, for the magnetic alloy powder particles 2 with the first insulator 3 adhered thereto, the second insulator 4 and the protrusion 5 are formed in argon plasma by introducing perfluorocarbon into a device.

As another method for producing the insulator-coated particles 1, a method of sprinkling powder particles serving as the forming material of the second insulator 4 onto the magnetic alloy powder particles 2 with the first insulator 3 adhered thereto is exemplified. Specifically, by using the cylindrical vessel 30 in Step S2 shown in FIG. 4, a powder of the forming material of the second insulator 4 is sprinkled onto the magnetic alloy powder particles 2 with the first insulator 3 adhered thereto while rotating the cylindrical vessel 30. The feeding of the powder is intermittently performed. At that time, the inside of the cylindrical vessel 30 may be heated. According to this, the protrusion 5 and the second insulator 4 are formed, whereby the insulator-coated particles 1 are produced.

Further, the first insulator 3, the second insulator 4, and the protrusion 5 may be continuously formed by performing the above operation for the magnetic alloy powder particles 2 to which the first insulator 3 is not adhered. In that case, the first insulator 3 and the second insulator 4 are composed of the same forming material.

According to this embodiment, the following effects can be obtained.

The eddy current loss between the particles in a high-frequency region can be reduced without decreasing the magnetic permeability and the DC dielectric strength. Specifically, the surface of the magnetic alloy powder particle 2 is coated with the insulator 7. In addition thereto, between the insulator-coated particles 1, the plurality of protrusions 5 included in each particle interfere with each other when the particles are compacted, so that the insulator-coated particles 1 are less likely to closely contact with each other. Therefore, the void 9 surrounded by the insulator 7 is generated, and the void 9 functions as another insulator, and thus, the eddy current loss between the particles can be reduced. Further, by coating the surface of the magnetic alloy powder particle 2 with the insulator 7, even if the particles are compacted and high voltage is applied, creeping discharge along the interface between the void 9 and the insulator 7 hardly occurs between the insulator-coated particles 1, and the DC dielectric strength can be ensured without increasing the film thickness of particularly the second insulator 4 in the insulator 7.

The insulator 7 encloses the first insulator 3 in a particulate form, and therefore, the plurality of protrusions 5 of the insulator 7 can be easily formed using the first insulator 3 as a nucleus.

The film thickness of the second insulator 4 is 2 nm or more, and therefore, the occurrence of creeping discharge is further suppressed, and the DC dielectric strength can be improved. The film thickness of the second insulator 4 is 20 nm or less, and therefore, the magnetic permeability can be improved.

The volume resistivity of the second insulator 4 is $1 \times 10^{14}$ $\Omega \cdot cm$ or more, and therefore, the occurrence of creeping discharge is further suppressed, and the DC dielectric strength can be improved. The volume resistivity of the second insulator 4 is $1 \times 10^{17}$ $\Omega \cdot cm$ or less, and therefore, the magnetic permeability can be improved.

The average particle diameter of the first insulator 3 is 4 nm or more, and therefore, the protrusion 5 of the insulator 7 becomes bulky. Accordingly, when the particles are compacted, the protrusions 5 of the insulator 7 more easily interfere with each other between the insulator-coated particles 1, and the void 9 surrounded by the insulator 7 is generated. This void 9 functions as another insulator, and thus, the eddy current loss between the insulator-coated particles 1 can be further reduced.

The average particle diameter of the first insulator 3 is 40 nm or less, and therefore, the protrusion 5 of the insulator does not become excessively bulky. Accordingly, when the insulator-coated particles 1 are compacted, the particles are not too away from each other. Therefore, the ratio of the insulator 7 and the void 9 to the magnetic alloy powder particle 2 hardly increases, and the decrease in magnetic permeability can be suppressed.

The relative permittivity of the first insulator 3 is 2 or more and 4 or less, and therefore, the permittivity between the magnetic alloy powder particles 2 in total is decreased together with the voids 9 formed by the protrusions 5. Accordingly, the eddy current loss can be reduced.

One particle of the first insulator 3 is present per 43 nm$^2$ to 10000 nm$^2$ surface area of the magnetic alloy powder particle 2, and therefore, when the particles are compacted, the void 9 surrounded by the insulator 7 can be easily generated by the protrusions 5. Specifically, the surface area of the magnetic alloy powder particle 2 in which one particle of the first insulator 3 is present is 43 nm$^2$ or more, and therefore, the plurality of protrusions 5 are not excessively dense, so that the void 9 is easily generated. Further, the surface area is 10000 nm$^2$ or less, and therefore, the plurality of protrusions 5 are not excessively sparse. Accordingly, the void 9 is easily generated, and also the protrusions 5 are hardly broken when the particles are compacted.

The powder magnetic core 100 is formed by compacting the insulator-coated particles 1, and therefore, the eddy current loss between the insulator-coated particles 1 in a high-frequency region can be reduced without decreasing the magnetic permeability and the DC dielectric strength.

2. Second Embodiment 2.1. Insulator-Coated Magnetic Alloy Powder Particle

Figure 5:
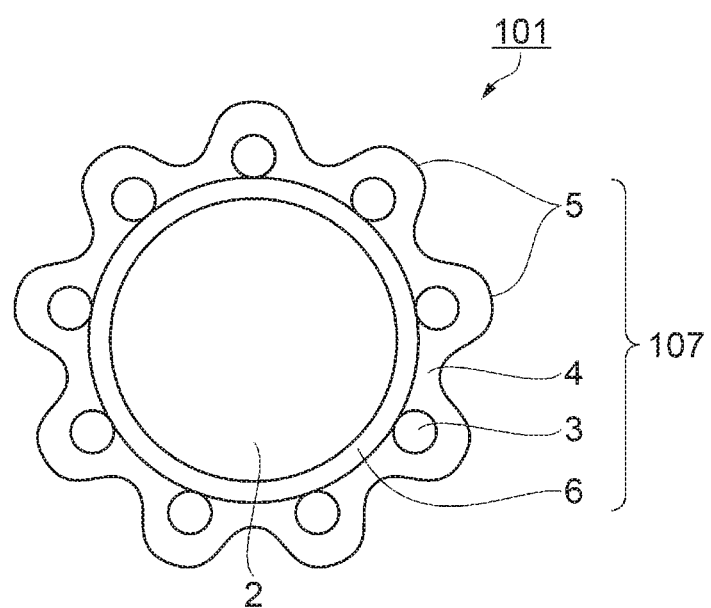
FIG. 5 is a schematic cross-sectional view showing one particle of an insulator-coated magnetic alloy powder particle according to a second embodiment.

A configuration of an insulator-coated magnetic alloy powder particle according to a second embodiment will be described. FIG. 5 is a schematic cross-sectional view showing one particle of the insulator-coated magnetic alloy powder particle according to the second embodiment. The insulator-coated magnetic alloy powder particle of this embodiment is made different in the configuration of the insulator with respect to the insulator-coated particle 1 of the first embodiment. Therefore, the same reference numerals are used to refer to the same constituent portions as those of the first embodiment, and a repetitive description is omitted.

As shown in FIG. 5, an insulator-coated magnetic alloy powder particle 101 of this embodiment includes the magnetic alloy powder particle 2 and an insulator 107. The insulator 107 coats the surface of the magnetic alloy powder particle 2 and has the plurality of protrusions 5 at the surface thereof. Note that in the following description, the insulator-coated magnetic alloy powder particle 101 is sometimes simply referred to as "insulator-coated particle 101".

2.2. Insulator

The insulator 107 includes a third insulator 6 in a film form, the first insulator 3 in a particulate form, and the second insulator 4 in a film form. That is, the insulator-coated particle 101 is different in that the third insulator 6 is included with respect to the insulator of the first embodiment.

The third insulator 6 coats the magnetic alloy powder particle 2 and is disposed between the magnetic alloy powder particle 2 and the first insulator 3 or the second insulator 4. The first insulator 3 is enclosed in each of the plurality of protrusions 5. The second insulator 4 coats at least a part of the surface of the first insulator 3 and a part of a surface of the third insulator 6. Specifically, the second insulator 4 coats the surface of each of the first insulator 3 and the third insulator 6 other than regions where the first insulator 3 and the third insulator 6 are in contact with each other of the surfaces thereof.

2.2.1. Third Insulator

The third insulator 6 is in a film form and coats the magnetic alloy powder particle 2. That is, the insulator 107 including the third insulator 6, the first insulator 3, and the second insulator 4 coats the surface of the magnetic alloy powder particle 2 so that the magnetic alloy powder particle 2 is not exposed at a surface of the insulator-coated particle 101. Therefore, a part of the first insulator 3 may be exposed at the surface of the insulator-coated particle 101 without being coated with the second insulator 4.

The film thickness of the third insulator 6 is 2 nm or more and 20 nm or less, more preferably 3 nm or more and 5 nm or less. The film thickness of the third insulator 6 can be found in the same manner as the film thickness of the second insulator 4 of the insulator-coated particle 1. Further, the volume resistivity of the third insulator 6 is $1 \times 10^{14}$ Ω·cm or more and $1 \times 10^{17}$ Ω·cm or less. According to this, the DC dielectric strength and the magnetic permeability in the insulator-coated particle 101 can be improved. For the volume resistivity of the third insulator 6, a known numerical value or a known measurement method can be adopted in the same manner as the first insulator 3. For the third insulator 6, the same forming material and forming method as those for the second insulator 4 can be adopted.

According to this embodiment, in addition to the effects of the first embodiment, the following effect can be obtained.

The magnetic alloy powder particle 2 is coated not only with the second insulator 4, but also with the third insulator 6, and therefore, the magnetic alloy powder particle 2 is further hardly exposed at the surface of the insulator-coated particle 101. Accordingly, even if the particles are compacted and high voltage is applied, creeping discharge further hardly occurs between the insulator-coated particles 101, and the eddy current loss can be further reduced.

3. Third Embodiment

Figure 6:
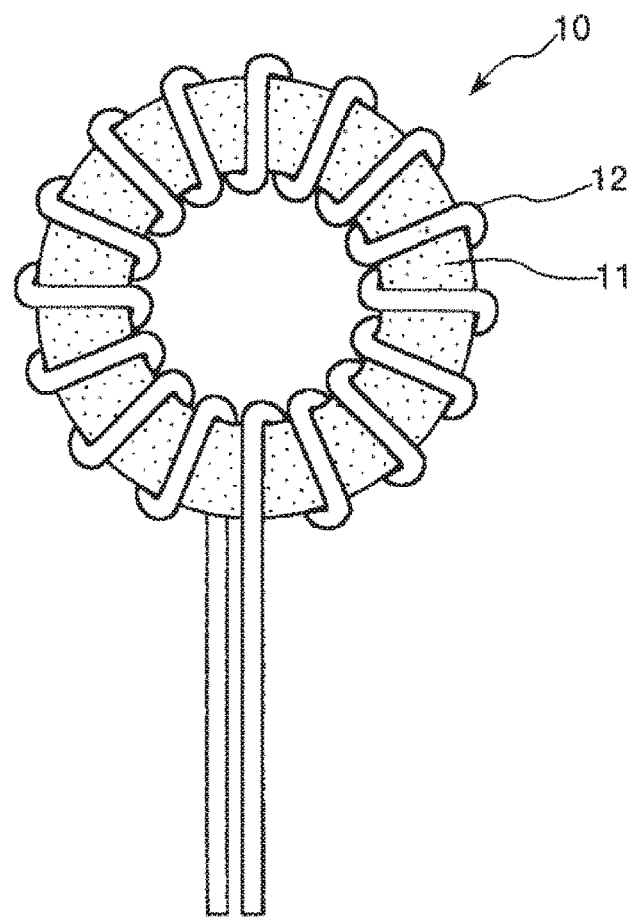
FIG. 6 is an external view of a toroidal coil as a coil part according to a third embodiment.

As a coil part according to a third embodiment, a toroidal coil will be illustrated. FIG. 6 is an external view of the toroidal coil as the coil part according to the third embodiment.

As shown in FIG. 6, a toroidal coil 10 of this embodiment includes a powder magnetic core 11 having a ring shape and a conductive wire 12 wound around the powder magnetic core 11. The powder magnetic core 11 is obtained by molding the powder magnetic core 100 of the first embodiment into a ring shape.

The powder magnetic core 11 is produced by mixing the insulator-coated particles 1 of the first embodiment and a binder, thereby forming a mixture, and compression molding the mixture. Examples of the binder include organic materials such as a silicone-based resin, an epoxy-based resin, a phenolic-based resin, a polyamide-based resin, a polyimide-based resin, and a polyphenylene sulfide-based resin, and inorganic materials such as phosphates such as magnesium phosphate, calcium phosphate, zinc phosphate, manganese phosphate, and cadmium phosphate, and silicates such as sodium silicate. The binder is not an essential component, and the powder magnetic core 11 may be produced without using the binder.

A forming material of the conductive wire 12 is not particularly limited as long as it is a material having high electrical conductivity, and examples thereof include metal materials including Cu (copper), Al (aluminum), Ag (silver), Au (gold), Ni (nickel).

At a surface of the conductive wire 12, a surface layer having an insulating property is provided though the illustration is omitted. By the surface layer, the occurrence of a short circuit between the powder magnetic core 11 and the conductive wire 12 is prevented. As a forming material of the surface layer, a known resin having an insulating property can be adopted.

The shape of the powder magnetic core 11 is not limited to the ring shape, and may be a shape in which a part of the ring is missing, a rod shape, or the like.

The powder magnetic core 11 may contain magnetic alloy powder particles other than the insulator-coated particles 1 of the above-mentioned embodiment or non-magnetic alloy powder particles as needed. When such powder particles are contained, the mixing ratio of the powder particles and the insulator-coated particles 1 is not particularly limited and is arbitrarily set. Further, as the powder particles other than the insulator-coated particles 1, a plurality of types may be used.

In this embodiment, the toroidal coil 10 is illustrated as the coil part, but the coil part is not limited thereto. Examples of the coil part to which the insulator-coated particles 1 are applied include an inductor, a reactor, a transformer, a motor, and a generator other than the toroidal coil. Such a coil part may include a powder magnetic core formed by compacting the insulator-coated particles 101 according to the second embodiment in place of the powder magnetic core 100.

The powder magnetic core 100 may be used for a magnetic element other than the coil part such as an antenna or an electromagnetic wave absorber.

According to this embodiment, the following effect can be obtained.

The toroidal coil 10 in which the eddy current loss between the particles in a high-frequency region is reduced without decreasing the magnetic permeability and the DC dielectric strength, and the performance is improved can be formed.

4. Fourth Embodiment

Figure 7:
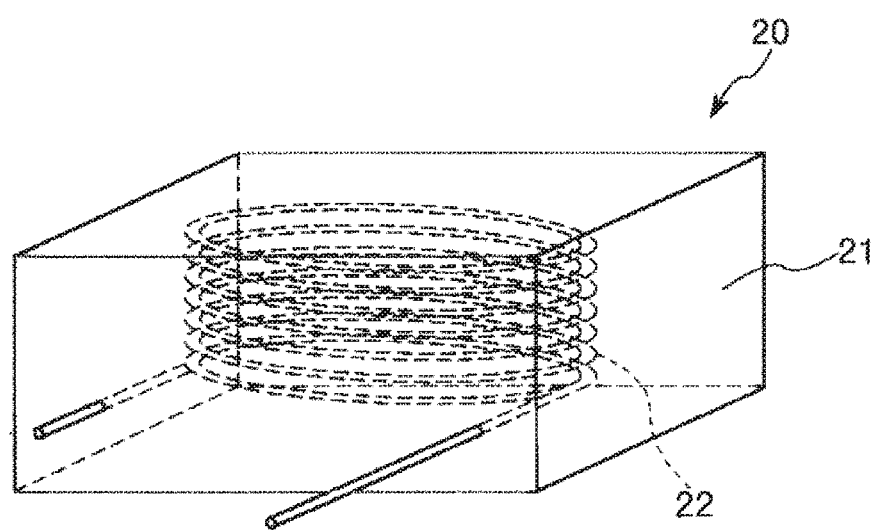
FIG. 7 is a transparent perspective view of an inductor as a coil part according to a fourth embodiment.

An inductor as a coil part according to a fourth embodiment will be illustrated. FIG. 7 is a transparent perspective view showing an inductor as the coil part according to the fourth embodiment.

As shown in FIG. 7, an inductor 20 of this embodiment includes a powder magnetic core 21 obtained by forming the powder magnetic core 100 of the first embodiment into a substantially rectangular parallelepiped shape. In the inductor 20, a conductive wire 22 molded into a coil shape is embedded inside the powder magnetic core 21. That is, the inductor 20 is formed by molding the conductive wire 22 with the powder magnetic core 21.

Since the conductive wire 22 is embedded inside the powder magnetic core 21, a gap is hardly generated between the conductive wire 22 and the powder magnetic core 21. Therefore, vibration of the powder magnetic core 21 due to magnetostriction is suppressed, and thus, the generation of noise accompanying vibration can be suppressed. In addition, since the conductive wire 22 is molded while being embedded in the powder magnetic core 21, the inductor 20 can be easily miniaturized.

The powder magnetic core 21 has the same configuration as the powder magnetic core 11 of the above-mentioned embodiment except that the shape is different. In the powder magnetic core 21, the insulator-coated particles 101 of the second embodiment may be used in place of the insulator-coated particles 1 of the first embodiment. The conductive wire 22 has the same configuration as the conductive wire 12 of the above-mentioned embodiment except that the molded shape is different.

According to this embodiment, the following effect can be obtained.

The inductor 20 in which the eddy current loss between the particles in a high-frequency region is reduced without decreasing the magnetic permeability and the DC dielectric strength, and the performance is improved can be formed.

5. Modification

The coil part using the powder magnetic core 100 of the above-mentioned embodiment can be applied to various types of electronic devices. Examples of the various types of electronic devices include notebook-type and laptop-type personal computers, a cellular phone, a digital still camera, a smartphone, a tablet terminal, a timepiece including a smartwatch, wearable terminals such as a smart glass and an HMD (head-mounted display), a television, a video camera, a videotape recorder, a car navigation system, a pager, an electronic notebook including a communication function, an electronic dictionary, an electronic calculator, an electronic gaming device, a word processor, a work station, a television telephone, a television monitor for crime prevention, electronic binoculars, a POS (Point Of Sale) system terminal, medical devices such as an electronic thermometer, a blood pressure meter, a blood sugar meter, an electrocardiogram monitoring device, an ultrasound diagnostic device, and an electronic endoscope, a fish finder, various types of measurement devices, an instrument to be mounted on vehicles, airplanes, and ships, a base station for mobile terminals, and a flight simulator. By using the coil part of the above-mentioned embodiment for such an electronic device, the performance is improved, and also miniaturization and high frequency adaptability are facilitated.

The coil part using the powder magnetic core 100 of the above-mentioned embodiment can also be applied to various types of devices included in various types of moving objects. Examples of the various types of devices include a keyless entry system, an immobilizer, a car navigation system, a car air conditioner control system, an anti-lock braking system (ABS), an airbag, a tire pressure monitoring system (TPMS), an engine control system, a braking system, a battery monitor for hybrid cars or electric cars, a car body posture control system, and an electronic control unit such as a self-driving system. In such various types of devices included in moving objects, by including the coil part of the above-mentioned embodiment, the performance is improved, and also miniaturization and high frequency adaptability are facilitated.

Hereinafter, the contents derived from the embodiments will be described.

An insulator-coated magnetic alloy powder particle includes a magnetic alloy powder particle and an insulator that coats a surface of the magnetic alloy powder particle and that has a plurality of protrusions at a surface thereof, wherein the insulator includes a first insulator in a particulate form enclosed in the protrusion, and a second insulator in a film form that coats at least a part of a surface of the first insulator.

According to this configuration, the eddy current loss between the particles in a high-frequency region can be reduced without decreasing the magnetic permeability and the DC dielectric strength. Specifically, the surface of the magnetic alloy powder particle is coated with the insulator. In addition thereto, between the insulator-coated magnetic alloy powder particles, the plurality of protrusions included in each particle interfere with each other, so that the insulator-coated magnetic alloy powder particles are less likely to closely contact with each other when the particles are compacted. Therefore, a void surrounded by the insulator is generated and the void functions as another insulator, and thus, the eddy current loss between the particles can be reduced. Further, by coating the surface of the magnetic alloy powder particle with the insulator, even if the particles are compacted and high voltage is applied, creeping discharge along the interface between the void and the insulator hardly occurs between the insulator-coated magnetic alloy powder particles, and the DC dielectric strength can be ensured without increasing the film thickness of particularly the second insulator in the insulator.

The insulator encloses the first insulator in a particulate form, and therefore, the plurality of protrusions of the insulator can be easily formed using the first insulator as a nucleus.

In the insulator-coated magnetic alloy powder particle, the film thickness of the second insulator is preferably 2 nm or more and 20 nm or less.

According to this configuration, the film thickness of the second insulator is preferably 2 nm or more, and therefore, the occurrence of creeping discharge is further suppressed, and the DC dielectric strength can be improved. The film thickness of the second insulator is 20 nm or less, and therefore, the magnetic permeability can be improved.

In the insulator-coated magnetic alloy powder particle, the volume resistivity of the second insulator is preferably $1 \times 10^{14}$ Ω·cm or more and $1 \times 10^{17}$ Ω·cm or less.

According to this configuration, the volume resistivity of the second insulator is $1 \times 10^{14}$ Ω·cm or more, and therefore, the occurrence of creeping discharge is further suppressed, and the DC dielectric strength can be improved. The volume resistivity of the second insulator is $1 \times 10^{17}$ Ω·cm or less, and therefore, the magnetic permeability can be improved.

In the insulator-coated magnetic alloy powder particle, the average particle diameter of the first insulator is preferably 4 nm or more and 40 nm or less.

According to this configuration, the average particle diameter of the first insulator is 4 nm or more, and therefore, the protrusion of the insulator becomes bulky. Accordingly, when the particles are compacted, the protrusions of the insulator more easily interfere with each other between the insulator-coated magnetic alloy powder particles, and a void surrounded by the insulator is generated. This void functions as another insulator, and thus, the eddy current loss between the insulator-coated magnetic alloy powder particles can be further reduced.

The average particle diameter of the first insulator is 40 nm or less, and therefore, the protrusion of the insulator does not become excessively bulky. Accordingly, when the insulator-coated magnetic alloy powder particles are compacted, the particles are not too away from each other. Therefore, the ratio of the insulator and the void to the magnetic alloy powder particle hardly increases, and the decrease in magnetic permeability can be suppressed.

In the insulator-coated magnetic alloy powder particle, the relative permittivity of the first insulator is preferably 2 or more and 4 or less.

According to this configuration, the permittivity between the magnetic alloy powder particles in total is decreased together with the voids formed by the protrusions. Accordingly, the eddy current loss can be reduced.

In the insulator-coated magnetic alloy powder particle, one particle of the first insulator is preferably present per 43 nm² to 10000 nm² surface area of the magnetic alloy powder particle.

According to this configuration, when the particles are compacted, the void surrounded by the insulator can be easily generated by the protrusions. Specifically, the surface area of the magnetic alloy powder particle in which one particle of the first insulator is present is 43 nm² or more, and therefore, the plurality of protrusions are not excessively dense, so that the void is easily generated. Further, the surface area is 10000 nm² or less, and therefore, the plurality of protrusions are not excessively sparse. Accordingly, the void is easily generated, and also the protrusions are hardly broken when the particles are compacted.

A powder magnetic core is formed by compacting the insulator-coated magnetic alloy powder particles.

According to this configuration, the powder magnetic core in which the eddy current loss between the particles in a high-frequency region is reduced without decreasing the magnetic permeability and the DC dielectric strength can be formed.

A coil part includes the powder magnetic core.

According to this configuration, the coil part in which the eddy current loss between the particles in a high-frequency region is reduced without decreasing the magnetic permeability and the DC dielectric strength, and the performance is improved can be formed.

A powder magnetic core is a powder magnetic core formed by compacting magnetic alloy powder particles, and an insulator that coats surfaces of the magnetic alloy powder particles, wherein the insulator includes a first insulator in a particulate form, and a second insulator in a film form that coats at least apart of a surface of the first insulator, and a void surrounded by the first insulator or the second insulator is included.

According to this configuration, the eddy current loss between the particles in a high-frequency region can be reduced without decreasing the magnetic permeability and the DC dielectric strength. Specifically, the void surrounded by the first insulator or the second insulator functions as another insulator, and therefore, even if the particles are compacted and high voltage is applied, creeping discharge hardly occurs between the insulator-coated magnetic alloy powder particles, and the eddy current loss can be reduced. That is, the DC dielectric strength can be ensured without increasing the film thickness of particularly the second insulator in the insulator.

The dependency of the DC dielectric strength on the film thickness of the second insulator is not high, and therefore, the magnetic permeability can be ensured by setting the film thickness of the second insulator thin. According to this, the powder magnetic core in which the eddy current loss between the particles in a high-frequency region is reduced without decreasing the magnetic permeability and the DC dielectric strength can be provided.

A coil part includes the powder magnetic core.

According to this configuration, the coil part in which the eddy current loss between the particles in a high-frequency region is reduced without decreasing the magnetic permeability and the DC dielectric strength, and the performance is improved can be formed.

What is claimed is:

1. An insulator-coated magnetic alloy powder particle, comprising:
    a magnetic alloy powder particle; and
    an insulator that coats a surface of the magnetic alloy powder particle and that has a plurality of protrusions at a surface thereof, wherein
    the insulator includes:
        a first insulator in a film form that coats the coats the surface of the magnetic alloy powder particle,
        a second insulator in a particulate form, wherein
            the first insulator is between the magnetic alloy powder particle and the second insulator, and
            the second insulator is enclosed in each of the plurality of protrusions, and
        a third insulator in a film form that coats at least a part of a surface of the second insulator and specific regions of the first insulator, wherein
            the second insulator is between the first insulator and the third insulator,
            the specific regions of the first insulator correspond to regions that are not in contact with the second insulator,
            the third insulator protrudes in a region that coats the second insulator,
            the protrusion of the third insulator corresponds to the plurality of protrusions, and
            a number of protrusions of the plurality of protrusions corresponds to a number of particles of the second insulator at the surface of the magnetic alloy powder particle.

2. The insulator-coated magnetic alloy powder particle according to claim 1, wherein the third insulator has a film thickness of 2 nm or more and 20 nm or less.

3. The insulator-coated magnetic alloy powder particle according to claim 1, wherein the third insulator has a volume resistivity of $1 \times 10^{14}$ Ω·cm or more and $1 \times 10^{17}$ Ω·cm or less.

4. The insulator-coated magnetic alloy powder particle according to claim 1, wherein the second insulator has an average particle diameter of 4 nm or more and 40 nm or less.

5. The insulator-coated magnetic alloy powder particle according to claim 1, wherein the second insulator has a relative permittivity of 2 or more and 4 or less.

6. The insulator-coated magnetic alloy powder particle according to claim 1, wherein one particle of the second insulator is present per 43 nm² to 10000 nm² surface area of the magnetic alloy powder particle.

7. A powder magnetic core, formed by compacting the insulator-coated magnetic alloy powder particles according to claim 1.

8. A coil part, comprising the powder magnetic core according to claim 7.

9. A powder magnetic core, formed by compacting
    magnetic alloy powder particles, and
    an insulator that coats surfaces of the magnetic alloy powder particles, wherein
    the insulator includes:
        a first insulator in a film form that coats the surfaces of the magnetic alloy powder particles,
        a second insulator in a particulate form, wherein
            the first insulator is between the magnetic alloy powder particles and the second insulator, and
            the second insulator is enclosed in each of a plurality of protrusions, and a third insulator in a film form that coats at least a part of a surface of the second insulator and specific regions of the first insulator, the specific regions of the first insulator correspond to regions that are not in contact with the second insulator, the third insulator protrudes in a region that coats the second insulator, the protrusion of the third insulator corresponds to the plurality of protrusions, a number of protrusions of the plurality of protrusions corresponds to a number of particles of the second insulator at the surface of the magnetic alloy powder particles, and a void surrounded by the second insulator or the third insulator is included.

10. A coil part, comprising the powder magnetic core according to claim 9.

* * * * *